(12) United States Patent
Fan et al.

(10) Patent No.: US 7,080,334 B2
(45) Date of Patent: Jul. 18, 2006

(54) AUTOMATIC CLOCK GATING INSERTION IN AN IC DESIGN

(75) Inventors: Yong Fan, Fremont, CA (US); Steve C. Huang, Saratoga, CA (US); Ihao Chen, San Jose, CA (US)

(73) Assignee: Incentia Design Systems Corp., Hsinchu (TW)

( * ) Notice: Subject to any disclaimer, the term of this patent is extended or adjusted under 35 U.S.C. 154(b) by 255 days.

(21) Appl. No.: 10/435,129

(22) Filed: May 9, 2003

(65) Prior Publication Data

US 2004/0225978 A1    Nov. 11, 2004

(51) Int. Cl.
G06F 17/50 (2006.01)
G06F 9/45 (2006.01)

(52) U.S. Cl. .......................... 716/6; 716/3; 716/4; 716/5
(58) Field of Classification Search ................. 716/1–8; 714/716–717, 731, 732, 30, 33, 45; 326/40, 326/46, 93; 327/16–17
See application file for complete search history.

(56) References Cited

U.S. PATENT DOCUMENTS

| 6,434,722 B1* | 8/2002 | Kawarabayashi et al. ...... 716/3 |
| 6,557,143 B1* | 4/2003 | Kitahara et al. ............... 716/1 |
| 6,567,017 B1* | 5/2003 | Medlock et al. .............. 341/50 |
| 6,601,221 B1* | 7/2003 | Fairbanks ...................... 716/5 |
| 6,658,635 B1* | 12/2003 | Tanimoto ....................... 716/6 |
| 6,691,286 B1* | 2/2004 | McElvain et al. ............. 716/3 |
| 6,745,377 B1* | 6/2004 | Baumgartner et al. ........ 716/6 |
| 2001/0014964 A1* | 8/2001 | Kawarabayashi et al. ..... 716/3 |

OTHER PUBLICATIONS

L. Benini et al., "Automatic Synthesis of Low-Power Gated-Clock Finite-State-Machines", IEEE Transaction on Computer Aided Design, vol. 15, No. 6, Jun. 1996, pp. 630-643.

(Continued)

Primary Examiner—A. M. Thompson
Assistant Examiner—Nghia M. Doan
(74) Attorney, Agent, or Firm—Morrison & Foerster LLP

(57) ABSTRACT

A computer implemented method is provided for deriving gated clock circuitry in an integrated circuit design, the method comprising: identifying a sequential element associated with a feedback loop in the design; producing a feedback loop signature associated with the feedback loop; wherein the signature includes an indication of feedback element instance type for each feedback element instance in the feedback loop, feedback position at each instance of a feedback element type in the feedback loop and a control signal for each instance of a feedback element type in the feedback loop; evaluating the feedback loop signature so as to generate associated stimulus logic; generating associated load logic; and inserting the generated stimulus logic to control a clock input to the sequential element; and inserting the generated load logic to provide a data input to the sequential element.

37 Claims, 7 Drawing Sheets

OTHER PUBLICATIONS

N. Raghavan et al., "Automatic Insertion of Gated Clocks at Register Transfer Level", IEEE 12th International Conference on VLSI Design, Jan. 1999, pp. 48-54.

P. J. Schoenmakers et al., "Clock Gating on RT-Level VHDL", IEEE ACM International Workshop on Logic Synthesis 1998, 5 pgs.

F. Theeuwen et al., "Power Reduction Through Clock Gating by Symbolic Manipulation", VLSI: Integrated Systems on Silicon, Chapman and Hall, London, 1997, 11 pgs.

Qing Wu et al., "Clock-Gating and Its Application to Low Power Design of Sequential Circuits", IEEE Transactions on Circuits and Systems, vol. 47, No. 3, pp. 415-420.

* cited by examiner

FIG. 4
```
always @(posedge clk)
  if (s3) begin
      if (s2) begin
          if (s1) begin
              q1 = d1;
          end
      end else begin
          q1 = d2;
      end
  end always @(posedge clk)
  if (s3) begin
      if (s2) begin
          if (s1) begin
              q2 = d3;
          end
      end else begin
          q2 = d4;
      end
  end
```

FIG. 5
```
wire t1 = s1 ? d1 : q1;
wire t2 = s2 ? t1 : d2;
wire t3 = s3 ? t2 : q1;

always @ (posedge clk)
begin
 q1 = t3;
end wire t4 = s1 ? d3 : q2;
wire t5 = s2 ? t4 : d4;
wire t6 = s3 ? t5 : q2;
always @(posedge clk)
begin
 q2 = t6;
end
```

```
module IdsGcNtwk_RISE_EDGE_top_1_1(idsGcGatedClk, idsGcOrigClk,
idsGcSelect);
input idsGcOrigClk, idsGcSelect;
output idsGcGatedClk;
reg idsGcLatchOut;
wire idsGcClkInv, n14;
    assign #1 idsGcClkInv = ~idsGcOrigClk ;
    always @( idsGcClkInv or idsGcSelect )
    begin
        if (idsGcClkInv) idsGcLatchOut <= idsGcSelect;
    end
    assign n14 = ~idsGcLatchOut ;
    AN2 idsGcAnd_u0 (.O(idsGcGatedClk), .I1(idsGcOrigClk),
.I2(idsGcLatchOut));

endmodule module top_1(clk, d1, d2, d3, d4, s1, s2, s3, q1, q2);
input clk, d1, d2, d3, d4, s1, s2, s3;
output q1, q2;
reg q1, q2;
wire t2, t5, n10, n11, idsGcFeedbackEnableNet,
idsGcFeedbackEnableNet_n0,
    idsGcNetForFeedbackEnable, idsGcNetForFFEnable, idsGcGatedClk;
    always @( posedge idsGcGatedClk )
    begin
        q1 <= t2;
    end
    assign n10 = ~q1 ;
    always @( posedge idsGcGatedClk )
    begin
        q2 <= t5;
    end
    assign n11 = ~q2 ;
    assign #1 t2 = (s2 ? d1 : d2);
    assign #1 t5 = (s2 ? d3 : d4);
    assign #1 idsGcFeedbackEnableNet = ~s3 ;
    assign #1 idsGcFeedbackEnableNet_n0 = ~s1 ;
    assign #1 idsGcNetForFeedbackEnable = idsGcFeedbackEnableNet_n0 &
s2 & s3 ;
    assign #1 idsGcNetForFFEnable = ~idsGcFeedbackEnableNet &
~idsGcNetForFeedbackEnable ;
    IdsGcNtwk_RISE_EDGE_top_1_1 idsGcInst
(.idsGcGatedClk(idsGcGatedClk), .idsGcOrigClk(clk),
        .idsGcSelect(idsGcNetForFFEnable));

endmodule
```

FIG. 7

```
module IdsGcNtwk_RISE_EDGE_top_1_1(idsGcGatedClk, idsGcOrigClk,
idsGcSelect);
input idsGcOrigClk, idsGcSelect;
output idsGcGatedClk;
reg idsGcLatchOut;
wire idsGcClkInv, n14;
    assign #1 idsGcClkInv = ~idsGcOrigClk ;
    always @( idsGcClkInv or idsGcSelect )
    begin
        if (idsGcClkInv) idsGcLatchOut <= idsGcSelect;
    end
    assign n14 = ~idsGcLatchOut ;
    AN2 idsGcAnd (.O(idsGcGatedClk), .I1(idsGcOrigClk),
.I2(idsGcLatchOut));

endmodule module top_1(clk, d1, d2, d3, d4, s1, s2, s3, q1, q2);
input clk, d1, d2, d3, d4, s1, s2, s3;
output q1, q2;
reg q1, q2;
wire t1, t2, t4, t5, n10, n11, idsGcGatedClk;
    always @( posedge idsGcGatedClk )
    begin
        q1 <= t2;
    end
    assign n10 = ~q1 ;
    always @( posedge idsGcGatedClk )
    begin
        q2 <= t5;
    end
    assign n11 = ~q2 ;
    assign #1 t1 = (s1 ? d1 : q1);
    assign #1 t2 = (s2 ? t1 : d2);
    assign #1 t4 = (s1 ? d3 : q2);
    assign #1 t5 = (s2 ? t4 : d4);
    IdsGcNtwk_RISE_EDGE_top_1_1 idsGcInst
(.idsGcGatedClk(idsGcGatedClk), .idsGcOrigClk(clk),
        .idsGcSelect(s3));

endmodule
```

FIG. 9

AUTOMATIC CLOCK GATING INSERTION IN AN IC DESIGN

BACKGROUND OF THE INVENTION

1. Field of the Invention

The invention relates in general to the development of an integrated circuit design, and more particularly, to the derivation of gated clock circuitry during integrated circuit design.

2. Description of the Related Art

Clock gating is a technique that reduces power dissipation by selectively stopping clock signals to portions of an integrated circuit during time periods when those portions are temporarily inactive. In clocked circuits, a clock signal ordinarily switches at every clock cycle and drives a relatively large capacitance. As a result, the clock signal can be a major source of dynamic power dissipation. Clock gating can reduce dynamic power dissipation of a circuit by preventing unnecessary transitions of sequential elements (e.g., registers, flip-flops) between logic levels. Specifically, for example, clock gating may disable a clock signal on a sequential element during a clock cycle when that element is to retain its current value. Disabling the clock to parts of a circuit that are not actively switching between logic levels during periods of such inactivity can reduce power dissipation. It may also reduce the total capacitance driven by a clock net. Control circuitry can be used to achieve clock gating. The control circuitry passes a clock signal to a circuit portion during clock cycles when that circuit portion may experience a logic transition and blocks the clock signal to that circuit portion during clock cycles when that circuit portion will not experience a logic transition.

Modern integrated circuit (IC) design has evolved into a specialized field often referred to as electronic design automation in which computers and computer aided design (CAD) techniques are used to automate the IC chip design process. Generally, an IC circuit design process begins with an engineer using a hardware design language (HDL) such as Verilog or VHDL, to describe the input/output signals, functionality and performance characteristics of the circuit. This description is provided to a computer that runs a logic synthesis program that generates or compiles a specification defining the integrated circuit in terms of a particular technology (e.g., very large scale integration). The specification may include a netlist that specifies the interconnection of functional cells in the circuit. The specification serves as a template for the design of a physical embodiment of the circuit in terms of transistors, input pins, output pins, wiring and other features involved in the layout of the chip.

F. Theeuwen and E. Seelen, *Power Reduction Through Clock Gating by Symbolic Manipulation*, VLSI: Integrated Systems on Silicon, R. Reis and L. Calesen, editors, Chapman and Hall, London, 1997 pp. 389–400, teach that it has been found that certain designs, such as microprocessor like designs, include many sequential elements that usually hold their data through most of the clock cycles. In other words, their stored data values change infrequently and ordinarily remain constant through most clock cycles. Logic synthesis programs have been developed that implement such data-holding capability for a given sequential element by producing a netlist that includes a conditional loop back from a data output of such element to its data input. If such loop back is active, then the value stored by the sequential element will not change. A sequential element with such feedback loop functionality may be viewed as being in a hold mode during a clock cycle when its current value is fed back to it as an input signal. Clock gating techniques have been used to avoid unnecessary power dissipation when a sequential element is to operate in a hold mode by stopping the clock to the element during clock intervals when a value stored by the element is to remain unchanged. Since such gated sequential element does not receive a triggering clock, it retains its currently stored value. Thus, clock gating advantageously reduces power dissipation by obviating the need to clock a sequential element when its feedback loop would have propagated its currently stored value back to its input. However, the taught approach does clock gating after logic synthesis, which could destroy the optimized netlist and timing. The computation based on ROBDD makes it difficult to be applied to larger design.

Several techniques have been proposed for inserting clock-gating circuitry into an IC design in order to reduce power consumption. For example, U.S. Pat. No. 6,434,722, entitled, Method of Changing Logic Circuit Portion into Gated Portion and Recording Medium Storing a Program for Carrying Out the Method, issued to Kawarabayashi, et al., teaches automatic extraction of a gated clock from a circuit design. Kawarabayashi et al. discuss as an example a relatively simple circuit design produced by a synthesis program that includes a combination of a multiplexer, a delay flip-flop (i.e., a sequential element) and a feedback loop. The multiplexer operates by receiving a clock enable signal and a data signal. The flip-flop is connected to the multiplexer and is turned on and off by the clock enable signal. The feedback loop is connected between the delay flip-flop and the multiplexer. Kawarabayashi et al. disclose a circuit synthesis technique to convert the above circuit into a low power circuit by removing the multiplexer and replacing it with gating control logic that clocks (or enables) the flip-flop only during clock cycles when its stored value may change. However, the approach taught by Kawarabayashi et al. is somewhat limited in that it discusses a circuit with a sequential element coupled in a feedback loop with only a single multiplexer in the feedback path.

L. Benini and G. De Micheli, *Automatic Synthesis of Low-Power Gated-Clock Finite-State Machines*, IEEE Transactions on Computer-Aided Design of Integrated Circuits and Systems, Vol., 15, No. 6, June 1996, describe an automated method to insert gated clocks in finite state machines (FSM). The authors observe that during the operation of an FSM, there are conditions during which the FSM is idle and neither its next state nor its output changes. Hence, clocking an FSM in an idle state wastes power. The authors propose clock gating an FSM so that it does not receive a clock signal during idle conditions. Unfortunately, there are shortcomings with the approach proposed by Benini et al. For instance, FSM based clock gating requires FSM extraction and synthesis which itself is a difficult problem. Also, FSM based clock gating design can incur significant capacity constraints on the design process because of the very large number of states to be considered in a typical IC design.

N. Raghavan, V. Akella and S. Bakshi, "*Automatic Insertion of Gated Clocks at Register Transfer Level*", 12th International Conference on VLSI Design, Goa, India, 1999, pp. 48–54, describe a register transfer level (RTL) based clock gating approach for VHDL. The authors disclose an algorithm that parses a RTL description of a circuit and determines idle conditions for an operation, i.e., the conditions under which the operation will not be performed. The algorithm involves looking for specific syntactic constructs that describe conditional behavior. For example, in VHDL, these would include if-then-else and case statements. This step involves parsing the RTL code and storing the conditional behavior information in an intermediate format. Next, the algorithm identifies signals and variables that do not change their value under idle conditions. The algorithm then isolates clocked elements associated with each of these signals and variables. A determination is made whether to insert clock gating for individual isolated clocked elements based upon estimates the net power savings that would be obtained by clock gating and the impact of clock gating on critical paths of the circuit. If a determination is made that clock gating should be inserted for a given clocked element, then syntax driven transformation rules are employed to insert a appropriate gated clock RTL description into the design. One drawback to the approach proposed by Raghavan et al. is that clock gating analysis based upon RTL language constructs is somewhat limited because actual design descriptions may not be ideally suited to such analysis. In other words, the RTL description can be difficult to interpret. Also, enumerating idle conditions based upon language constructs can be a difficult problem tantamount to an elaborate truth table. Furthermore, although the authors describe a specific implementation suitable for VHDL this implementation is not so readily adaptable to other hardware description languages such as Verilog.

P. Schoenmaker and J. Theeuwen, "Clock Gating on RT-Level VHDL", IEEE ACM International Workshop on Logic Synthesis 1998, describe a technique for grouping sequential elements with similar hold conditions so that they can be clocked by the same gated clock circuitry. The authors explain that the addition of clock gating circuitry incurs additional area overhead and power dissipation, and that clock gating circuitry is best justified if it governs enough sequential elements that share a similar hold condition. The technique involves producing a fully expanded description of a design with nets that are flattened. Values are computed for every net using binary decision diagrams (BDDs). When the BDDs for all nets have been computed, they are grouped in hold domains. Each hold domain is governed by its own gated clock. A possible difficulty with the approach suggested by Schoenmaker et al. is that BDDs are compute intensive and potentially not well suited to large-scale designs.

Q. Wu, M. Pedram and X. Wu, "Clock-Gating and Its Application to Low Power Design of Sequential Circuits", IEEE Transactions on Circuits and Systems, Vol. 47, No. 3, pp. 415–420, propose using a quaternary variable to model clock behavior in a sequential circuit. The up and down transition condition of each flip-flop is derived from a state table. Then a covering relation is computed to find out the so-called transition propagate and transition generate terms. One shortcoming of this proposed approach is that a derivation of transition condition and covering relation may require sophisticated Boolean manipulation which may limit its usefulness for larger real-world designs. The state table based input also may limit its practical use.

Thus, there has been a need for improvement in the synthesis of clock gating circuits. The present invention meets this need.

SUMMARY OF THE INVENTION

The present invention is premised on the observation that if a feedback loop exists for a sequential element then there is potential of a reloading effect, which unnecessarily consumes power. By reloading effect, it is meant that when the feedback loop is active a data value provided as an output of the sequential element may be reloaded into the sequential element at the clock triggering edge. By extracting the condition when reloading is to occur, it is possible to effectively turn off the clock signal when the reload condition occurs, and to thereby reduce power consumption.

In one embodiment, a computer implemented method is provided for deriving gated clock circuitry in an integrated circuit design. The method involves identifying sequential elements and feedback loops in the design. Feedback loops can alternatively provide load data or reload data to their associated sequential elements. A feedback loop signature is produced for each of one or more sequential elements and its associated one or more feedback loops. Each feedback loop signature indicates feedback elements, positions of the indicated feedback elements and feedback control signals applied to the indicated feedback elements. The feedback loop signature is evaluated so as to generate associated stimulus logic that receives as input at least one associated feedback loop control signal and that provides as output an associated clock control signal. The provided clock control signal has a clock enable value during clock intervals when an associated load value would be provided to such sequential element by its associated feedback loop. The provided clock control has a clock disable value during clock intervals when an associated reload value would be provided to such sequential element by its associated feedback loop. The associated feedback loop is evaluated so as to generate associated load logic that receives as input at least one associated feedback loop control signal and that provides as output an associated load data signal during clock intervals when the associated stimulus logic signature produces an associated clock control signal with a clock enable value.

These and other features and advantages of the invention will be more fully understood from the appended claims and the following detailed description and drawings of embodiments of the invention.

BRIEF DESCRIPTION OF THE DRAWINGS

FIG. 4 is a first illustrative RTL description of a circuit design using the Verilog high level design language.

FIG. 5 is a second illustrative RTL description of equivalent circuit designs using the Verilog language.

FIG. 7 is an illustrative RTL description of a circuit design with clock gating derived from the design of FIG. 6 in accordance with an embodiment of the invention.

FIG. 9 is an illustrative drawing of an RTL representation of a partial clock gating result for one sequential element of the circuit design of FIG. 6 where clock gating is performed for only one feedback loop of the illustrated sequential element in accordance with an embodiment of the invention.

DETAILED DESCRIPTION OF THE PREFERRED EMBODIMENTS

The following description is presented to enable any person skilled in the art to make and use the invention, and is provided in the context of particular applications and their requirements. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and devices are shown in block diagram form in order not to obscure the description of the invention with unnecessary detail. Thus, the present invention is not intended to be limited to the embodiments shown, but is to be accorded the widest scope consistent with the principles and features disclosed herein.

Figure 1:
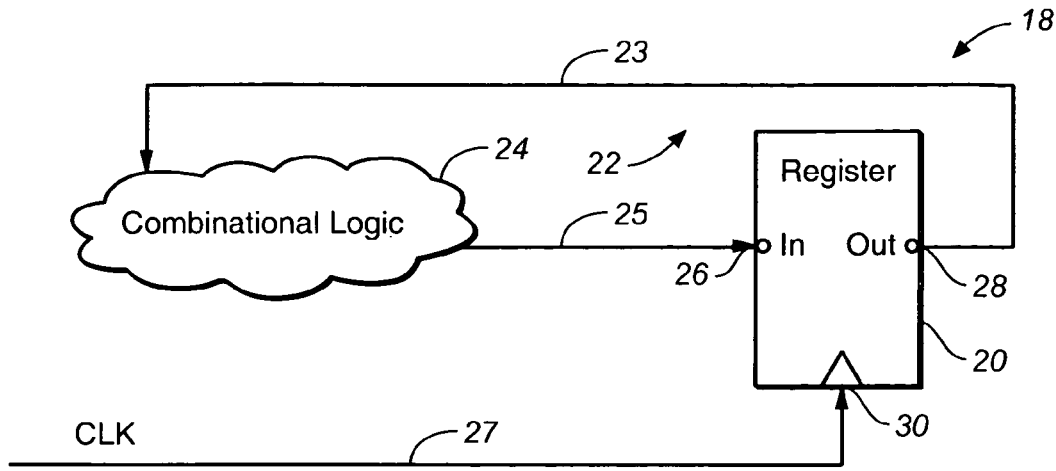
FIG. 1 is an illustrative drawing of a sequential element associated with a feedback loop that includes arbitrary combinational logic circuitry.
Figure 2:
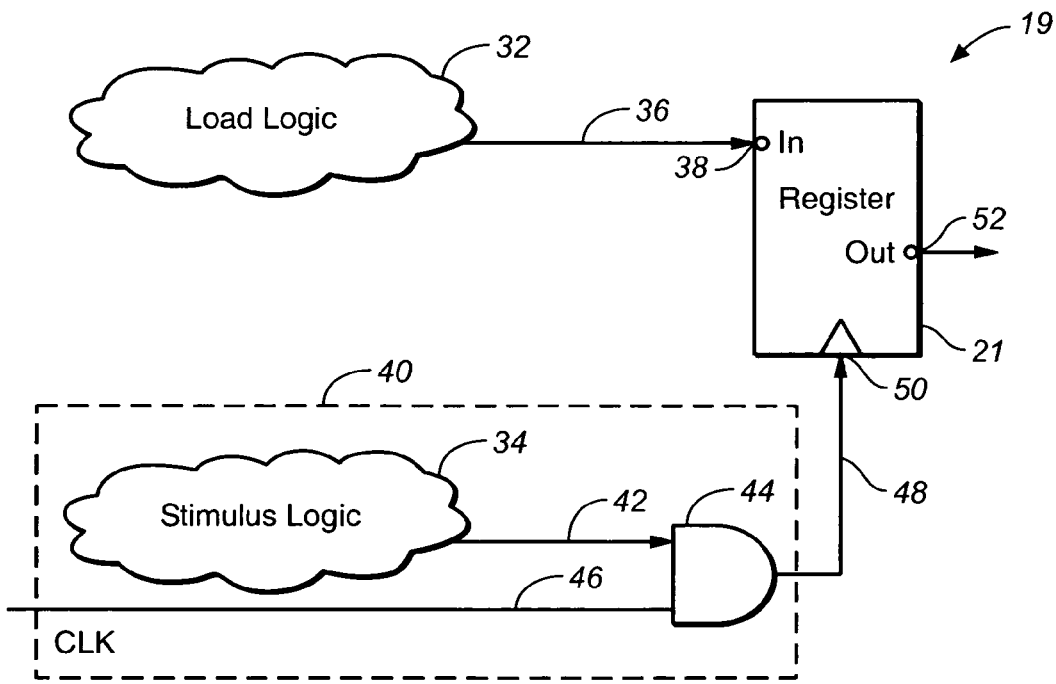
FIG. 2 is an illustrative drawing of a gated clock circuit design which includes a sequential element, load logic and stimulus logic that achieve the same functionality as the design of FIG. 1 except that clock gating blocks unnecessary sequential element clocking.

FIG. 1 is an illustrative drawing of a circuit design 18 which includes a sequential element 20 associated with a feedback loop 22 without clock gating. FIG. 2 is an illustrative drawing of a gated clock circuit design 19 which includes the same sequential element 21 and also includes load logic 32 and stimulus logic 34 generated to achieve clock gating in accordance with a present embodiment of the invention. The overall functionality of the circuit designs 18 and 19 of FIGS. 1 and 2 are the same. However, the circuit design 18 of FIG. 1 is not clock gated, while circuit design 19 shown in FIG. 2 is clock gated. Clock gating in design 19 avoids unnecessary clocking of sequential element 21 during clock cycles when stored data is to remain unchanged.

FIG. 1 is an illustrative drawing of a circuit design 18 that includes a sequential element 20 (e.g., register) associated with a feedback loop 22 and arbitrary combinational logic circuitry 24. The combinational logic circuitry 24 may pass either load data or reload data to a data input node 26 of the sequential element 20. Reload data is data that is fed back from an output node 28 of sequential element 20 to its input node 26. Load data is data other than reload data. The associated feedback loop 22 includes a data signal path 23 from the output node 28 of the sequential element 20 to the combinational logic 24. The associated feedback loop 22 also includes a data signal path 25 from the combinational logic circuitry 24 to the input node 26 of the sequential element 20. An ungated clock signal path 27 couples a clock signal source CLK to a clock node 30 of the sequential element 20.

The combinational logic 24 is shown conceptually as a 'cloud' since the constituent elements comprising the combinational circuitry can have arbitrary functionality. In other words, the logical functionality of the combinational logic circuitry 24 is unimportant to the practice of the invention. The sequential element 20 is identified as a register, although other types of sequential elements can be used instead of a register. It will be appreciated that the feed back loop 22 permits feedback of reload data from data output node to data input node of sequential element 20. This reloading, or data feedback, can result in unnecessary power dissipation.

FIG. 2 is an illustrative drawing of a gated clock circuit design 19 derived from the circuit design of FIG. 1. Load logic circuitry 32 provides load data input on data path 36 to a data input node 38 of sequential element 21. Clock gating circuitry 40 provides a gated clock signal to a clock node of sequential element 21. The clock gating circuitry 40 includes stimulus logic circuitry 34. In the illustrative example FIG. 2, the stimulus logic circuitry produces a clock control signal on clock control line 42. A logic circuit, an AND gate 44 in the example, uses the clock control signal to control gating of a clock signal provided by clock source CLK on clock signal path 46. The gated clock signal is provided on gated clock path 48 to a clock node 50 of sequential element 21. Note that there is no feedback loop to propagate a value (i.e., a reload value) stored by sequential element 21 from a data output node 52 back to its data input node 38.

As used herein, stimulus logic of a sequential element is a logic block whose output will result in clock triggering of the sequential element when load data is to be input to the sequential element. Conversely, a logic function that enables a feedback loop (where the reloading happens) is referred to herein as sleep logic or reload logic.

As used herein, load logic of a sequential element is a logic block whose output is loaded into the sequential element input node when the stimulus logic causes an enabling clock triggering of the sequential element. The load logic effects the loading of load data to the sequential element. A formal definition of load logic is:

$$\text{load\_logic(reg)} = (\text{original\_data\_input\_logic\_of\_reg}) | (\text{stimulus\_logic(reg)} == 1)$$

where | represents a generalized co-factoring.

As used herein, a feedback loop of a sequential element is signal path from the sequential element output node to its data input node. A sequential element may be associated with more than one feedback loop.

A process in accordance with the invention receives as input the ungated circuit design 18 of FIG. 1 and converts it to the clock gated circuit design 19 of FIG. 2. The process evaluates the combinational logic circuitry 24 of circuit design 18. The process generates load logic circuitry 32 that achieves the non-feedback portion of the functionality of the combinational logic circuitry 24. That is, for non-feedback data signals, the load logic circuitry 32 provides the same data signal input to node 38 of sequential element 21 that combinational logic circuitry 24 provides to the data input node 26 of sequential element 20. Unlike the circuit design 18 of FIG. 1, however, the load logic circuitry 32 of circuit design 19 of FIG. 2 does not effect feedback of data signals from data output node to data input node of its associated sequential element 21. The clock gating circuitry 40 provides clock signals during clock cycles when the combinational logic is to provide data that may change the value stored by sequential element 21. The clock gating circuitry 40 blocks clock signals during clock cycles when the value stored in the sequential element 21 is to remain unchanged. Clock intervals when the clock gating circuitry 40 of FIG. 2 blocks clock signals, correspond to situations when combinational logic circuitry 24 of FIG. 1 would cause data signal feedback from data output node to data input node of the sequential element 20.

The invention, therefore, employs a concept of separated stimulus logic and load logic in the gating clock context. An embodiment of the invention described herein extracts these two functions from an RTL description or abstract representation of a circuit design. The separation of stimulus logic and load logic can have benefits for circuit timing consideration, for example, because this separation can facilitate a better balance on the two potential critical paths. The stimulus logic provides a signal path to clock input of a sequential element. The load logic provides a separate signal path for the data input of the sequential element.

Figure 3:
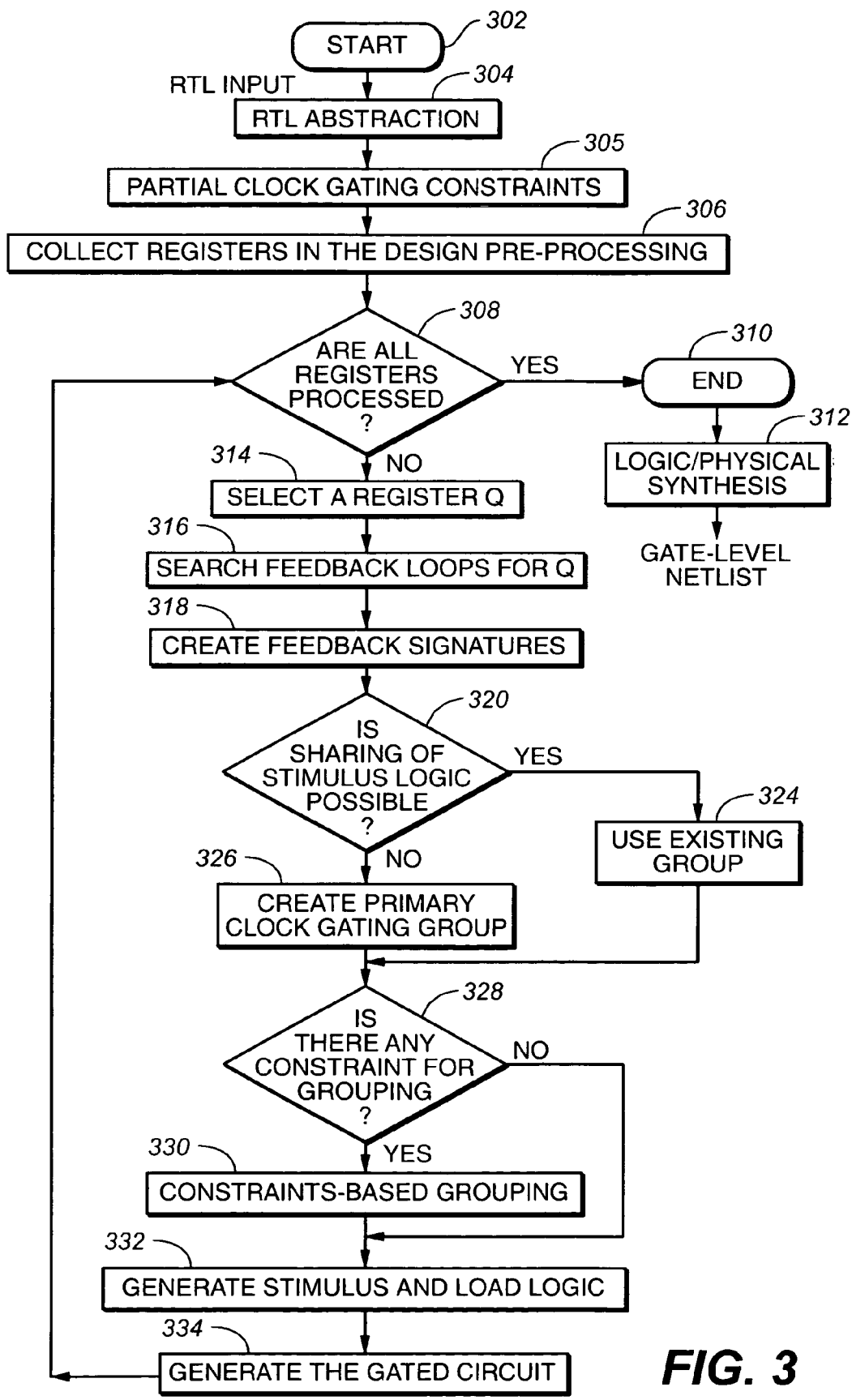
FIG. 3 is a flow diagram representing a computer program controlled process to insert clock gating in a circuit design in accordance with one embodiment of the invention.

FIG. 3 is a flow diagram 300 representing a computer program controlled process to insert clock gating in a circuit design in accordance with one embodiment of the invention. Persons skilled in the art will appreciate that a computer program implementing the process illustrated in flow diagram 300 can be encoded in computer readable media.

The following pseudo-code represents a simplified overview of the overall flow of the program.

```
Algorithm1: implement_gating_clock( )
circuit = rtl_abstraction(design)
for each register q in the circuit {
  collect_feedback_loops(q)
  create_clock_gating_group(q)
  build_gating_clock(q)
}
```

Basically, an abstract representation of a circuit design is produced from an RTL description of the design. All feedback loops around sequential elements (i.e., registers) are identified. Sequential elements are identified that are suitable for sharing of clock gating circuitry. The clock gating circuitry is generated.

Referring again to FIG. 3, at the start, in step 302, an abstract representation of a circuit design such as an RTL description of a circuit design (e.g., a VHDL or Verilog description) is provided to an RTL abstraction process 304. The abstraction process 304 converts the RTL description to an operation-based representation of the circuit design. In one embodiment, the operation-based representation comprises a generic netlist representation of the circuit design. Such a netlist representation is 'abstract' or generic. For example, gates of the netlist are not mapped to any particular cell library. It will be appreciated that different libraries may map the same functionality into different types of gates. For example, a gate in a netlist that conceptually performs a logical OR function might be mapped into one or more different types of logical gates (e.g., NOR, NAND, XOR) depending upon the nature of the cell library.

In step 305, a user (designer) may specify a partial clock gating constraint. A partial clock gating constraint in essence determines how completely clock gating is to be specified for sequential elements in a design. A design may include sequential elements associated with multiple feedback loops. For reasons such as practical limitations on design tool runtime, a partial clock gating constraint may be applied to set a maximum limit on the number of feedback loops to be processed for a sequential element. The upshot of a partial clock gating constraint is that clock gating for a sequential element having multiple feedback loops may be only partially specified since one or more feedback loops may remain unprocessed and carry through to the final design.

In step 306, all sequential elements (e.g., registers) are identified and pre-processed. In a present embodiment, the RTL abstraction step 304 produces an operation-based representation of a circuit design that includes registers with synchronous set and reset input nodes. As a consequence, several pre-processing transformations are performed on these registers to facilitate clock-gating insertion. Basically, pre-processing step 306 transforms these SR registers into a more general type of sequential element that can be clock gated more readily.

One of three alternate pre-processing transformations may be performed. The transformations are dominance high transformation, dominance low transformation, and dominance unknown transformation. Normally, the set input node and the reset input node of an SR register do not simultaneously receive a logical active value. The three different transformations prescribe three alternative ways to handle the aberrant case where both set and rest nodes receive an active signal during transformation of an SR register to a more general type sequential element.

Dominance High

In the dominance high alternative, if both set and reset are logical high then the output (Q) is set to logical high. In other words, in the dominance high case synchronous set signals have higher priority than synchronous reset signals. Given a register q with synchronous set input ss, synchronous reset input sr and data input d, the following equivalent circuit is constructed:

if (ss+sr)

$$q=ss+sr'*d$$

Dominance Low

In the dominance low alternative, if both set and reset are logical high then the output (Q) is set to logical low. In other words, in the dominance low case synchronous reset signals have higher priority than synchronous set signals. Given a register q with synchronous set input ss, synchronous reset input sr and data input d, the following equivalent circuit is constructed:

if (ss+sr)

$$q=sr'*(ss+d)$$

Dominance Unknown

The dominance unknown alternative is used when the priority is unknown as between synchronous sets and reset signals. This situation is resolved by assuming that one of the two inputs controls. The assumption is that operation will be the same as that of the dominance high case above. Thus, given a register q with synchronous set input ss, synchronous reset input sr and data input d, the following equivalent circuit is constructed:

if (ss+sr)

$$q=ss+sr'*d$$

In decision step 308 a determination is made as to whether or not all identified sequential elements have been processed. If so, then the process ends 310 and a logical/physical synthesis process 312 can produce a gate level netlist having sequential elements with gated clocks. If not, then sequential elements are processed one at a time. An output of the logical/physical synthesis process 312, which forms no part of the actual invention, is a mapped gate level netlist.

In step 314, a sequential element is selected for evaluation. In step 316, a search is made for feedback loops associated with the selected sequential element. In step 318, feedback loop signatures are determined for feedback loops identified as being associated with the selected sequential element.

As used herein, a signature of a feedback loop comprises the instance types in the feedback loop, the control signals for each instance, the feedback position at each instance.

For convenience of implementation, certain simplified assumptions are used in the extraction and identification of feedback loop instance types. One simplification is that feedback loops consisting of multiplexing and selection operations are processed. This does not represent a significant limitation because the multiplexer function is universal, in that any Boolean expression can be expressed by multiplexer function based on Shannon expansion:

$$f(x1, x2, \ldots, xn) = x1 * f(1, x2, \ldots, xn) + x1' * f(0, x2, \ldots, xn)$$

Persons skilled in the art will appreciate that there are a variety of types of multiplexers that may be employed consistent with the invention. For example, a relatively simple multiplexer includes two input nodes and a single output node and a single selection control node. The provision of a first logical value to the selection control node causes an input signal provided on one of the two input nodes to be provided as an output signal on the single output node. The provision of a second logical value to the selection control node causes an input signal provided on the other of the two input nodes to be provided as an output signal on the single output node. A more complex multiplexer, for example, may include more than two input nodes, at least one output node and two or more control signal nodes. A combination of control signals is provided to the control signal nodes to cause an input signal provided on one of the multiple input nodes to be provided as an output signal on the at least one output node. In a 'one hot' multiplexer, there may be a group of multiple control nodes associated with a multiplexer, but only one control node of the group is permitted to be 'true' at any given time. In a 'priority based' multiplexer, there may be multiple control nodes associated with a multiplexer with a prescribed priority among control signals provided to these multiple control nodes.

The following pseudo-code represents a simplified representation of the overall flow of steps 314–318 of the program.

```
Algorithm2: collect_feedback_loops( ) start from register q's
output pin for each destination pin p{ perform DFS search from p
if (a feedback loop is found) { compute feedback signature add
the loop to the feedback loop set of the register } }
```

Essentially, these steps identify an output node of a sequential element being processed. These steps involve performing a depth-first search (DFS) for all feedback loops that feed data signals from the identified output node back to the sequential element. In a DFS approach, the deepest feedback loop is identified first, followed by the next deepest, etc. A feedback loop signature is determined for each identified feedback loop. As explained more fully below with reference to the examples, a given feedback loop signature indicates the elements in a given feedback loop, the position of the elements in the given feedback loop and certain signals provided to the indicated elements. Each identified feedback loop and its signature are stored for possible clock gating generation.

In decision step 320, a determination is made as to whether it is possible for a sequential element under consideration to share stimulus logic circuitry with one or more other sequential elements. One advantage of sharing stimulus logic is reduced chip area, for example. In order to reduce the chip area occupied by clock gating circuitry, it is advantageous to group sequential elements that can share stimulus logic circuitry into primary clock gating groups.

If decision step 320 determines that stimulus logic sharing is possible between a sequential element under consideration and members of an existing primary clock gating group, then in step 322, the sequential element under consideration is added to an existing group with which it can share. If decision step 320 determines that sharing is not possible, then in step 326 a new primary clock-gating group is created that includes as its first member the sequential element under consideration.

Ideally, a determination of whether the stimulus logic circuitry of two sequential elements is equivalent would involve a determination of logical equivalence. However, the processing cost of such an ideal solution may be too great to justify the effort. Therefore, in one embodiment of the invention, equivalence is determined based upon a comparison of the structures of the feedback loops used to derive the stimulus logic being compared. More particularly, equivalence may be determined based upon a test for equivalence of a structure of a given feedback loop to the respective structures of feedback loops associated with previously identified primary clock gating groups.

It will be appreciated that a comparison for structural equivalence rather than logical equivalence may result in a determination that two structurally different feedback loops are not equivalent, even though they are logically equivalent. This approach can lead to some redundancy in the circuit design since logically equivalent circuits sometimes may not be grouped together in the same primary clock-gating group. However, it is believed that the risk of such redundancy is a reasonable tradeoff for the efficiency of a structure-oriented process of equivalence testing.

In accordance with an embodiment of the invention, each different set of sequential elements eligible to share stimulus logic circuitry is referred to herein as being a different primary clock-gating group. A requirement for assigning two or more sequential elements to the same primary clock-gating group is that they should have equivalent feedback loops. A heuristic for equivalence testing in accordance with one embodiment of the invention uses the following two definitions.

Definition 1. Feedback loop L1 is less than feedback loop L2 if the following condition is satisfied and it is denoted as L1<L2:

L1.length<L2.length||L1.length==L2.length &&
  L1.signature<L2.signature

The length of a feedback loop is the number of instances in the feedback loop. For a feedback loop L1, its length is denoted as L1.length. Thus, in accordance with the first definition, two feedback loops are not equivalent if they have different lengths or if they have the same length, but their signatures are different.

Definition 2. Feedback loop L1 is equal to feedback loop L2 if the following condition is satisfied and it is denoted as L1=L2:

L1.length==L2.length &&
  L1.signature==L2.signature

Thus, according to the second definition, two feedback loops are equivalent if their lengths are the same and their signatures are the same.

The following pseudo-code represents a simplified representation of the structural equivalence heuristic of steps 320–326.

```
Algorithm3: create_primary_clock_gating_group( )
  sort the feedback loops for each register by definitions 1 and 2
  if (registers have the same clock and all feedback loops are
  equal) { return existing primary clock gating group } else {
  create new primary clock gating group }
```

In decision step 328, a determination is made as to whether there are any additional constraints upon sequential element grouping. If so, then in step 330 sequential elements are further grouped in accordance with such additional constraints. The partitioning of sequential elements into primary clock gating groups shall be referred to herein as unconstrained grouping. Thus, unconstrained grouping essentially constructs a number of cliques based on the equivalence relation of the stimulus logic among different sequential elements. However, in practice, this grouping may not be the optimal for a number of reasons. For example, fanouts of certain stimulus logic may be too large because it drives too many sequential elements, which may result in timing deterioration.

For that reason grouping of sequential elements may be further constrained by partitioning of one or more primary clock gating groups based upon designer specified constraints, for example. These refined clock-gating groups are referred to herein as secondary clock gating groups. Each secondary clock-gating group is a subset of some primary clock-gating group.

Definition 3. Register $q1$ and register $q2$ in the same primary clock gating group are 'similar' if the following condition is satisfied and it is denoted as $q1 \sim q2$.

similar($q1$, $q2$)

The similar function can be of a number of varieties:
(1) In fact, the unconstrained grouping can be treated as a special case of constrained grouping where the similar function is defined as:

similar_function($q1$, $q2$)=$q1$'s feedback loops==$q2$'s feedback loops (2) After physical placement, some registers are placed far from each other, in this case, it may be unwise to have them share the stimulus logic because long wires degrade timing and create obstacles for routing. Therefore, a designer could specify a similarity function based on physical location of the register:

similar($q1$, $q2$)=|coordinates of $q1$−coordinates of $q2$|<delta

In this alternative example secondary grouping scenario it is assumed that the logical synthesis process may be iterative with the physical placement process. In other words, clock gating may be adjusted based upon interim physical placement results.

(3) A designer may introduce a constraint aimed at limiting the maximum load a stimulus logic drives. More particularly, a designer may define a similarity function as follows to force further partitioning of the primary clock gating group to satisfy this requirement:

similar($q1$, $q2$)=# elements in the secondary group of $q1$ and $q2$<=MAX_FANOUT_ALLOWED In this alternative example, the examiner specifies an upper limit of fanout for a clock gating group.

(4) A designer may want to specify which sequential elements should be in the same group. This might be achieved by issuing a command like, "set_gating_ clock_group list_of_registers_or_signals". In this case, the similarity function can be defined as:

similar($q1$, $q2$)=$q1$ and $q2$ are in the same designer specified list

In this alternative example, the designer specifically constrains the grouping of sequential elements.

In step 332, the stimulus logic and the load logic are generated. Stimulus logic may be shared among sequential elements of primary or secondary clock gating groups. Thus, stimulus logic ordinarily need be generated only for the first sequential element member of a primary or secondary clock gating group. In general, load logic is not shared among sequential elements, and therefore, ordinarily should be generated for each sequential element.

Generation of the stimulus logic for a sequential element is premised on the observation that a sequential element ordinarily is in only one of two states at any time. In one state currently stored data is reloaded into a sequential element. In the other state, new data is loaded into the sequential element. The reload state corresponds to a feedback condition in which reload data is fed back from a sequential element data output node through a feedback loop and back to a sequential element data input node. The new data state corresponds to a non-feedback condition in which new data is fed to the sequential element input node.

Thus, there are two alternative approaches to generating the stimulus logic for a given sequential element. A first approach is to evaluate feedback loop signatures so as to identify the feedback condition(s) (or reload condition(s)), and then determine the stimulus logic that is the inversion of feedback condition. A second approach is to evaluate feedback loop signatures so as to identify the non-feedback condition directly for each feedback loop, and then obtain the overall stimulus condition.

A pseudo-code representation of the first approach is as follows.

$$\text{stimulus\_logic}(q) = \text{NOT} \sum_{i=1}^{n} (\text{feedback\_condition}(Li))$$

where $Li$ is a feedback loop for register $q$ and $n$ is the number of feedback paths for $q$. Under this first approach, all feedback conditions are negated to produce the stimulus logic, since the stimulus logic is intended to trigger the sequential element only during non-feedback situations.

Generation of the load logic for a sequential element is based on feedback loop structure information extracted during feedback loop traversal. As explained above, new data can be propagated to a sequential element input node only during a new data state in which a non-feedback state exists. Breaking the feedback loop of the sequential element at all feedback points leaves behind remaining logic that in essence represents the load logic circuitry. In a present embodiment, feedback loops are broken by injecting constant values as the control signals in the loop to so that external (new) data can pass through.

The following pseudo-code represents a simplified representation of the step 332 of the program. In the following, Algorithm5 is a service algorithm of Algorithm4. Variable q is one register. Variable U is one multiplexer. Variable L is one loop. The 'feedback points' are collected during Algorithm1.

```
Algorithm4: build_stimulus_logic( )
    for each feedback loop L of a register q {
        build_sleep_logic(q, L)
    }
    overall stimulus logic = NOT Σ (sleep logic of each feedback loop)
Algorithm5: build_sleep_logic( )
    for each instance U on the feedback loop L{
        get_sleep_logic_at_instance(U)
    }
    sleep logic of the loop = Π (sleep logic of all instances)
Algorithm6: build_load_logic( )
    for each feedback loop of a register {
        get the feedback points
        inject constant values at corresponding control signals
    }
```

In the usual case, the stimulus generation logic step 332 generates stimulus logic that for all feedback loops of a given sequential element. For instance, if a given sequential element is coupled to potentially reload from two feedback loops, then the stimulus generation logic generation step 332 ordinarily generates stimulus logic for both loops. A sequential element associated with more than one feedback loop shall be referred to as a multi-feedback sequential element. However, there are some circumstances in which it may not be desirable to produce stimulus logic for one or more feedback loops associated with a multi-feedback sequential element. For instance, generating stimulus logic for particularly long feedback loops may degrade design software runtime performance. Alternatively, for example, clock gating circuitry produced using stimulus logic that encompasses all of the feedback loops may be so large and consume so much power as to negate the typical power saving benefits of clock gating.

Partial clock gating is a technique employed in one embodiment of the invention to avoid these shortcomings. Partial clock gating limits the number of feedback loops to be processed for any given multi-feedback sequential element and the maximum length of the feedback loops allowed. A partial clock gating constraint that can be introduced in step 305 can set a maximum limit on the number of feedback loops to be processed. In one sense, a user selected constraint on the number of feedback loops to be processed represents a user's judgement as to an acceptable tradeoff between clock gating quality and runtime performance.

In step 334, clock gating logic is generated based upon the stimulus logic. The generation of clock gating logic also may be based upon design specific factors such as whether a sequential element is to be triggered by a positive triggering clock edge or a negative triggering clock edge, for example. In one embodiment positive clock edge triggering is achieved through use of gating control logic that uses an AND logic gate, and negative clock edge triggering is achieved through use of gating control logic that uses an OR logic gate. The generation of gating clock logic also may involve insertion of latch circuitry to avoid timing glitches, for example.

Upon completion of step 334, the process 300 returns to step 308 whereupon the next sequential element is processed.

EXAMPLES

The following examples illustrate the operation of an embodiment of the invention.

Figure 6:
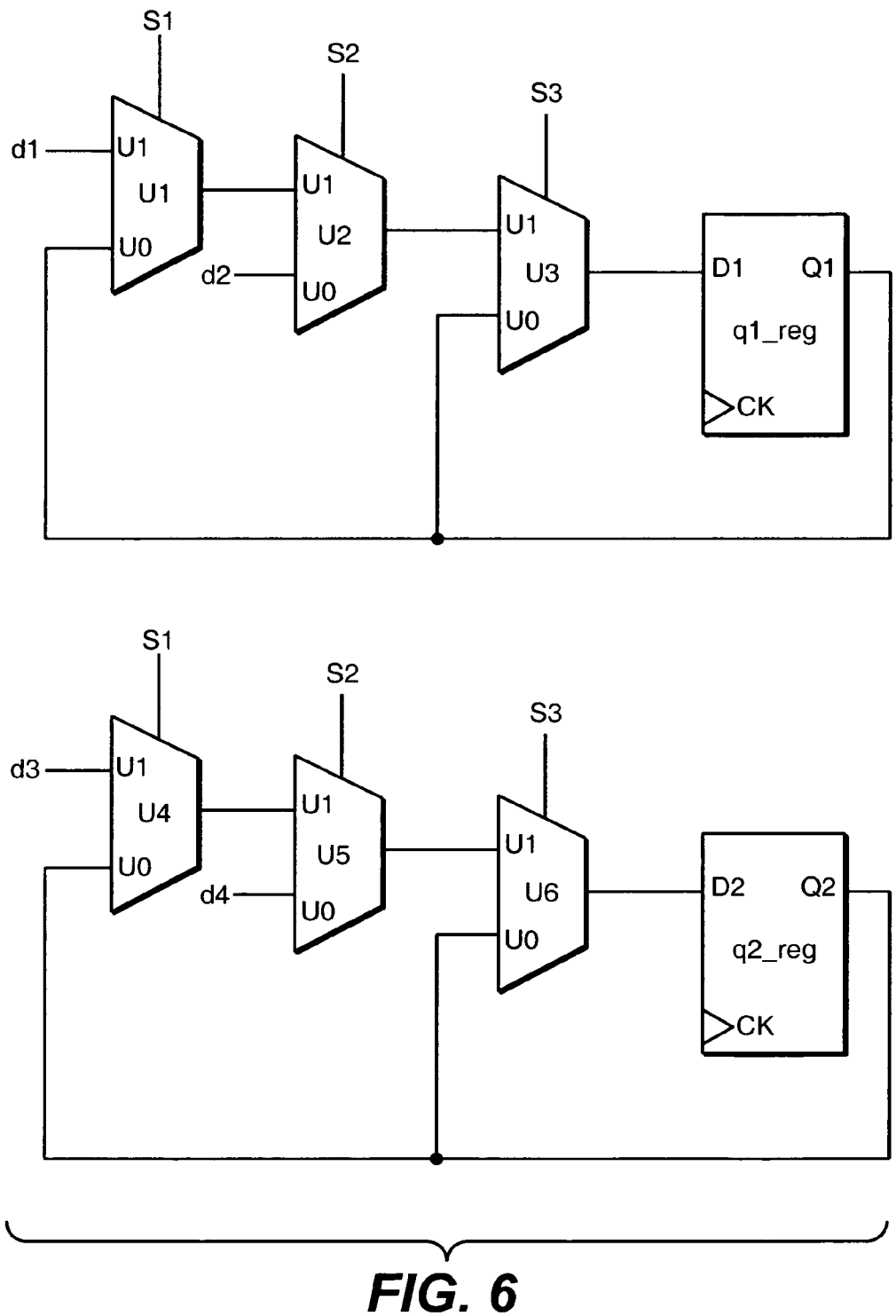
FIG. 6 is illustrative drawing of an abstract representation of the circuit design of FIGS. 4 and 5.
Figure 8:
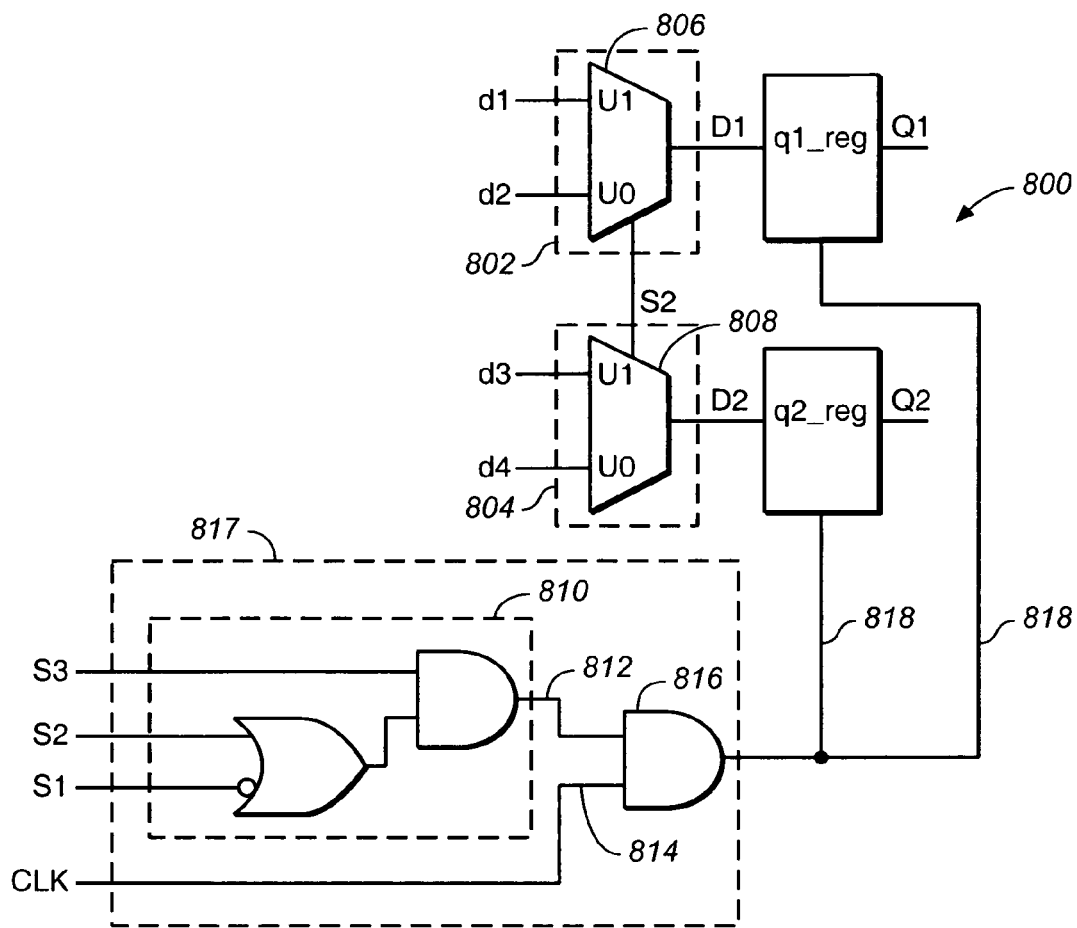
FIG. 8 is an illustrative drawing of an abstract circuit design with clock gating derived for the design of FIG. 6 in accordance with an embodiment of the invention.

FIG. 4 is a first illustrative RTL description of a circuit design using the Verilog high level design language. FIG. 5 is a second illustrative RTL description of an equivalent circuit design using the Verilog language. FIG. 6 is illustrative drawing of an abstract representation of a circuit design represented by the code of FIGS. 4 and 5. FIG. 7 is an illustrative RTL description of a circuit design with clock gating derived from the design of FIG. 6 in accordance with an embodiment of the invention. FIG. 8 is an illustrative drawing of an abstract circuit design with clock gating derived from the design of FIG. 6 in accordance with an embodiment of the invention.

Referring to FIGS. 4–6, the example circuit design portion includes two sequential elements. The sequential elements are registers, q1_reg and q2_reg in this example. Each register is coupled in two feedback loops.

A first register q1_reg is associated with two feedback loops. A first feedback loop of the first register q1_reg begins at data output node Q1 of the first register q1_reg and includes a feedback path segment from Q1 to u0 input node of multiplexer U1. The first feedback loop of the first register q1_reg also includes a feedback path segment from an output node of U1 to a u1 input node of multiplexer U2. The first feedback loop of the first register q1_reg also includes a feedback path segment from an output node of U2 to a u1 input node of multiplexer U3. The first feedback loop of the first register q1_reg also includes a feedback path segment from an output node of U3 to a data input node D1 of the first register q1_reg.

A second feedback loop of the first register q1_reg begins at data output node Q1 of the first register q1_reg and includes a feedback path segment from Q1 to a u0 input node of multiplexer U3. The second feedback loop of the first register q1_reg also includes a feedback path segment from an output node of U3 to the data input node D1 of the first register q1_reg.

A second register q2_reg is associated with two feedback loops. A first feedback loop of the second register q2_reg begins at data output node Q2 of the second register q2_reg and includes a feedback path segment from Q2 to a u0 input node of multiplexer U4. The first feedback loop of the second register q2_reg also includes a feedback path segment from an output node of U4 to a u1 input node of multiplexer U5. The first feedback loop of the second register q2_reg also includes a feedback path segment from an output node of U5 to a u1 input node of multiplexer U6. The first feedback loop of the second register q2_reg also includes a feedback path segment from an output node of U3 to a data input node D2 of the second register q2_reg.

A second feedback loop of the second register q2_reg begins at data output node Q2 of the second register q2_reg and includes a feedback path segment from Q2 to a u0 input node of multiplexer U6. The second feedback loop of the second register q2_reg also includes a feedback path segment from an output node of U6 to the data input node D2 of the second register q2_reg.

It will be appreciated, for example, that when feedback loop control signal s1 has a logical 1 value, data input d1 on node u1 of multiplexer U1 is selected. Conversely, when feedback loop control signal s1 has a logical 0 value, feedback value Q1 output by the first register q1_reg, and provided on node u0 of multiplexer U1, is selected. Selection control of the other multiplexers U2–U6 operates in an analogous manner.

In accordance with Algorithm2 used in one embodiment of the invention, a depth first search traversal is conducted on each sequential element (i.e., registers q1_reg and q2_reg) in order to identify loops associated with each sequential element.

Starting from the data output node Q1 of the first register q1_reg identifies two feedback loops, q1/L1 and q1/L2.

Feedback loop q1/L1 includes three instances {U1, U2, U3}. The following loop signature represents the structure of feedback loop q1/L1:
    control signals:     {s1, s2, s3}
    instance types:     {mux, mux, mux}
    feedback positions:     {0, 1, 1}
Feedback loop q1/L2 includes one instance {U3}. The following loop signature represents the structure of feedback loop q1/L2:
    control signals:     {s3}
    instance types:     {mux}
    feedback positions:     {0}
Feedback loop q2/L1 includes one instance {U6}. The following loop signature represents the structure of feedback loop q2/L1:
    control signals:     {s3}
    instance types:     {mux}
    feedback positions:     {0}
Feedback loop q2/L2 includes three instances {U1, U2, U3}. The following loop signature represents the structure of feedback loop q2/L2:
    control signals:     {s1, s2, s3}
    instance types :     {mux, mux, mux}
    feedback positions:     {0, 1, 1}

Note that there is no guarantee that the traversal order will be the same for different registers as shown in the example.

Next, in accordance with Algorithm3 of an embodiment of the invention, the feedback loop signatures are sorted so that they can be more easily compared. This canonicalization step makes it easier to assess the possibility of sharing stimulus logic circuitry among different registers.

In this example the sorting step does not change feedback loop designations for the two feedback loops associated with the second register q2_reg. However, the sorting step does change the designations of the feedback loops associated with the first register q1_reg. Specifically, in this example, after the sorting step the feedback loops coupled to the first register are designated as follows:

Feedback loop q1/L1 includes one instance {U3}:
    control signals:     {s3}
    instance types:     {mux}
    feedback positions:     {0}
Feedback loop q1/L2 includes three instances {U1, U2, U3}:
    control signals:     {s1, s2, s3}
    instance types :     {mux, mux, mux}
    feedback positions:     {0, 1, 1}

Using the equivalency definitions (Definition 1 and Definition 2) described above, a determination is made that in this example, q1/L1=q2/L1 and q1/L2=q2/L2 and that they are eligible to share clock gating circuitry. In other words, the first feedback loops of the first and second registers are structurally equivalent, and the second feedback loops of the first and second registers also are structurally equivalent. Therefore, it is determined that q1_reg and q2_reg can share the same stimulus logic.

Next, in a present embodiment of the invention, stimulus logic and load logic are generated for registers q1_reg and q2_reg using Algorithm4, Algorithm5 and Algorithm6. In order to simplify the explanation, a description of stimulus logic generation and load logic generation is provided only for the first register, q1_reg.

Considering q1/L1 first, when feedback loop control signal s3 has the value of '0', the Q1 data output node of q1_reg feeds back to the D1 data input node of q1_reg. Thus, the reload condition of feed back loop q1/L1 is:

reload_condition(q1/L1)=s3'

Considering q1/L2 next, the feedback can only happen when the feedback switch of each instance (U1, U2, U3) in the feedback loop is turned on. Thus, the reload condition of feed back loop q1/L2 is:

reload_condition(U1)=s1' reload_condition(U2)=s2 reload_condition(U3)=s3

Therefore, $$\text{reload\_condition}(q1/L2) = \prod_{i=1}^{3} \text{reload\_condition}(Ui)$$
$$= s1' * s2 * s3$$

Thus the stimulus logic function for the first register q1_reg is:

stimulus_logic(q1)=NOT Σ(reload_condition(q1/L1), reload_condition(q1/L2))=(s1+s2')*s3

The stimulus logic for the first register is calculated as the negation of the logic required to reload a currently stored value back into the first register.

By noting that feedback loop q1/L1 starts at U3/u0 node and feedback loop q1/L2 starts at U1/u0 node, it is determined that injecting constant value logical 1 at s1, constant value logical 0 at s3 will break the feedback loop. Thus, the load logic can be obtained as:

load(q1)=s2*d1+s2'*d2

In order to shorten the description herein, the explanation of the derivation of the stimulus and load logic for q2_reg are not set forth but will be understood by persons skilled in the art from the description provided for q1_reg.

FIGS. 7–8 show results of changes to the circuit design of FIGS. 4–6 after generating clock gating circuitry in accordance with the present invention. FIG. 7 shows the RTL description result after gating clock is implemented. FIG. 8 is an abstract circuit representation of the design of FIG. 7.

More particularly, FIG. 8 shows a clock gated circuit design 800 that includes the first register q1_reg having a D1 input node coupled to receive data input from first load logic circuitry 802. The circuit design 800 includes the second register q2_reg having a D2 input node coupled to receive data input from second load logic circuitry 804. The first load logic circuitry 802 includes a multiplexer 806 which receives load data input d1 on its u1 data input node and which receives a load data input d2 on its u0 input data node. The multiplexer 806 provides an output signal selected from d1 and d2 as an input to the D1 node of the first register q1_reg. The second load logic circuitry 804 includes a multiplexer 808 which receives data input d3 on its u1 data input node and which receives a data input d4 on its u0 input data node. The multiplexer 808 provides an output signal selected from d3 and d4 as an input to the D2 node of the second register q2_reg. Feedback loop control signal s2 controls the operation of both load multiplexers 806, 808.

The circuit design 800 includes stimulus logic circuitry 810. The stimulus logic receives as input feedback loop control signals s1, s2 and s3. The stimulus logic 810 provides as output a clock control signal on line 812. A clock source (not shown) provides a clock signal CLK on line 814. Lines 812 and 814 are coupled to the clock control signal and the clock signal as inputs to gating control logic gate 816. Logic gate 816 is an AND logic gate in this example circuit design. An output 818 of gate 816 is provided to the clock nodes of the first and second registers q1_reg, q2_reg. The stimulus logic 810, its clock control output 812, the clock line 814 and logic gate 816 together comprise gated clock circuitry 817 that drives the clock nodes of the first and second registers q1_reg, q2_reg.

Thus, the respective first and second registers are respectively associated with respective first and second load logic 802, 804. The first and second registers share stimulus logic 810. The first and second registers also share gated clock circuitry 817.

Figure 10:
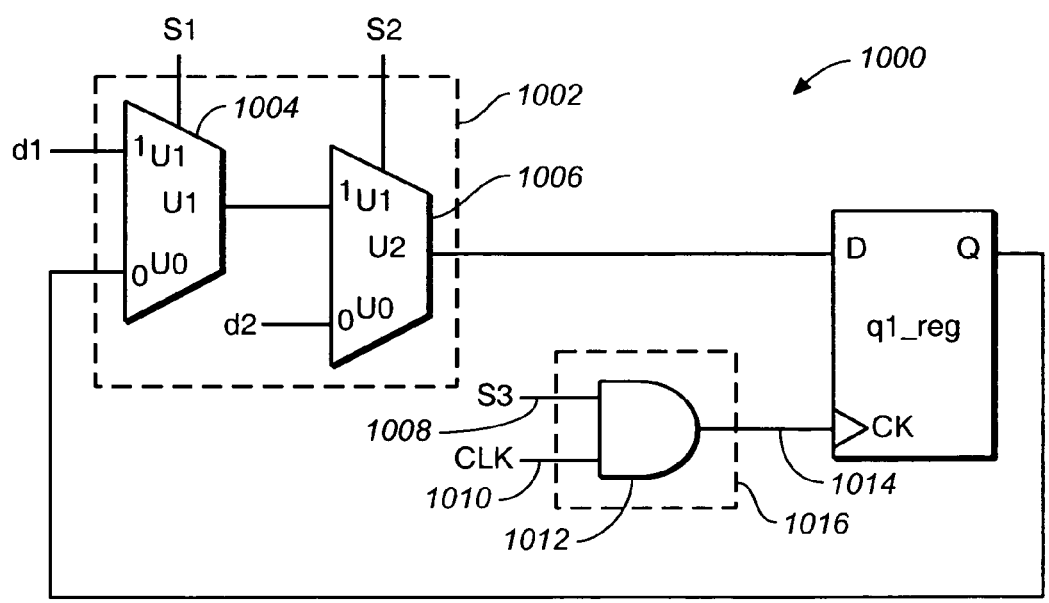
FIG. 10 is an illustrative drawing of an abstract circuit representation of the partial clock gating design of FIG. 9 in accordance with an embodiment of the invention.

FIGS. 9–10 show the circuit design of FIGS. 4–6 after generating clock gating with a partial clock gating design constraint that limits feedback loop processing to the inner feedback loop only. FIG. 9 is an illustrative drawing of an RTL representation of a partial clock gating result on q1_reg if clock gating is performed using only feedback loop q1/L1. FIG. 10 is an illustrative drawing of an abstract circuit representation of the partial clock gating design of FIG. 9.

In order to simplify the drawings, FIG. 10 shows load logic and gating logic for only one of the two registers of the design of FIG. 6. Specifically, FIG. 10 shows register q1_reg but not q2_reg. It will be appreciated that since the separate feedback loops associated with q1_reg and associated with q2_reg in FIG. 6 are substantially identical (in terms of topology), persons skilled in the art will appreciate that the drawing of FIG. 10 suffices to illustrate results for processing for both q1_reg and q2_reg.

More particularly, FIG. 10 shows a partial gated clock circuit design 1000 that includes a register q1_reg having a D input coupled to receive data from load logic circuitry 1002. The load logic circuitry 1002 includes a first multiplexer 1004 and a second multiplexer 1006. The first multiplexer 1004 receives a d1 data input on its u1 node and receives a Q output from q1_reg on its u0 node and receives a feedback loop control signal S1 on a control signal node. The second multiplexer 1006 receives an output of the first multiplexer as an input to its u1 node and receives a d2 data input on its u0 node and receives a feedback loop control signal s2 on a control signal node. The circuit design 1000 also includes stimulus logic circuitry 1008 which consists of a feedback loop control line that provides feedback loop control signal s3. In this example, the stimulus logic circuitry 1008 comprises only a control line which also serves as a clock control signal. A clock source (not shown) provides a clock signal CLK on line 1010. Lines 1008 and 1010 are coupled to provide inputs to logic gate 1012. Gating control logic gate 1012 is an AND logic gate in this example circuit design. An output 1014 of gate 1012 is provided to a clock node of sequential element q1_reg. The stimulus logic 1008, the clock line 1010 and logic gate 1012 together comprise gated clock circuitry 1016 that drives the clock node of sequential element q1_reg.

Referring to FIGS. 6, 8 and 10, it will be appreciated that different partial clock gating constraints were set in step 305 to achieve the different results in FIGS. 8 and 10 from the design of FIG. 6. For example, in order to arrive at the design of FIG. 8, the partial clock gating constraint was set to process at least up to three (and perhaps more) feedback loops. In order to arrive at the design of FIG. 10, the partial clock gating constraint was to process no more than one feedback loop.

It will be understood that the foregoing description and drawings of preferred embodiments in accordance with the present invention are merely illustrative of the principles of the invention. Various modifications can be made by those skilled in the art without departing from the spirit and scope of the invention.

What is claimed is:

1. A computer implemented method of deriving gated clock circuitry in an integrated circuit design comprising:

identifying a sequential element in the design;

identifying multiple respective feedback loops in the design associated with the identified sequential element;

wherein each respective identified feedback loop alternatively provides load data or provide reload data to their associated sequential elements;

for each respective identified feedback loop, producing a feedback loop signature associated with such sequential element, that indicates respective feedback elements associated with the feedback loop, indicates respective feedback positions at the indicated feedback elements associated with the feedback loop and indicates respective feedback control signals applied to the indicated feedback elements associated with the feedback loop;

evaluating the respective feedback loop signatures so as to generate associated stimulus logic that receives as input at least one associated feedback loop control signal;

provides as output an associated clock control signal that has a clock enable value during clock intervals when an associated load value would be provided to such sequential element by its associated feedback loop and that has a clock disable value during clock intervals when an associated reload value would be provided to such sequential element by its associated feedback loop;

generating associated load logic, that receives as input at least one associated feedback loop control signal; and provides as output at least one load data signal during clock intervals when the associated stimulus logic signature produces an associated clock control signal with a clock enable value.

2. The method of claim 1, wherein evaluating the feedback loop signature associated with such sequential element so as to generate associated stimulus logic involves calculation of a negation of logic required to reload a currently stored value back into such sequential element.

3. The method of claim 1, wherein evaluating the feedback loop signature associated with such sequential element so as to generate associated stimulus logic involves direct calculation of logic required to avoid reload of a currently stored value back into such sequential element.

4. The method of claim 1, further including:

receiving an integrated circuit design description that includes a register transfer level (RTL) description; and converting the RTL description to an abstract representation of circuit design.

5. The method of claim 4, wherein converting involves converting the RTL description to a generic netlist.

6. The method of claim 1,
wherein identifying feedback loops involves identifying each circuit path between a data output node and a data input node for the identified sequential elements.

7. The method of claim 1,
wherein each respective feedback element includes a multiplexer.

8. The method of claim 1, further including:
for each of the respective one or more identified sequential elements with at least one associated feed back loop, replacing at least one feedback element of the at least one associated feedback loop by,
inserting associated clock gating control logic into the design description;
wherein the associated clock gating control logic includes,
an associated gating control element,
associated generated stimulus logic, and
a clock signal source,
wherein the gating control element receives as input a clock control signal output by the associated generated stimulus logic and also receives as input a clock source signal provided by the clock source and provides as output a clock input signal to a clock input node of such sequential element; and
inserting into the design description associated generated load logic that provides an associated load data output signal as a data input to such associated sequential element.

9. The method of claim 1, further including:
comparing respective feedback loop signatures to identify one or more corresponding sets of sequential elements associated with respective equivalent feedback loops; and
grouping into respective clock gating groups respective sequential elements associated with equivalent feedback loops;
wherein generating stimulus logic involves generating respective at least one shred stimulus logic associated with all of the sequential elements of an at least one respective identified clock gating group.

10. The method of claim 1, further including:
comparing respective feedback loop signatures to identify one or more corresponding sets of sequential elements associated with respective equivalent feedback loops; and
grouping into a respective primary clock gating group respective sequential elements associated with equivalent feedback loops;
further grouping respective sequential elements in the respective primary clock gating group into at least first and second secondary clock gating groups based upon at least one criterion; and
wherein generating stimulus logic involves generating respective first shared stimulus logic associated with the sequential elements of the first secondary clock gating group; and
wherein generating stimulus logic involves generating respective second shared stimulus logic associated with the sequential elements of the second secondary clock gating group.

11. The method of claim 10 wherein the at least one criterion includes a criterion selected from the group: physical placement, fanout and user selection.

12. The method of claim 1,
wherein identifying feedback loops includes identifying multiple feedback loops associated with at least one identified multi-feedback sequential element; and
wherein generating associated stimulus logic includes generating associated stimulus logic for the at least one identified multi-feedback sequential element; and
wherein generating associated load logic includes generating associated load logic for the at least one identified multi-feedback sequential element.

13. The method of claim 1,
wherein identifying feedback loops includes identifying multiple feedback loops associated with at least one identified multi-feedback sequential element;
wherein generating associated stimulus logic includes generating associated stimulus logic for some but not all feedback loops associated with at least one identified multi-feedback sequential element; and
wherein generating associated load logic includes generating associated load logic for some but not all feedback loops associated with at least one identified multi-feedback sequential element.

14. The method of claim 1,
wherein generating associated load logic involves breaking at least one identified feedback loop and removing at least one feedback element associated with the at least one broken feedback loop.

15. The method of claim 1,
wherein generating associated load logic involves breaking at least one identified feedback loop and removing at least one feedback element associated with the at least one broken feedback loop.

16. An article of manufacture comprising:
a computer readable medium encoded with program code to program a computer to perform the process of:
identifying sequential elements in the design;
identifying one or more respective feedback loops in the design associated with respective identified sequential elements in the design;
wherein each respective identified one or more feedback loops alternatively provides load data or provide reload data to their associated sequential elements;
for each of respective one or more identified sequential elements with respect to at least one associated feedback loop, producing a feedback loop signature associated with such sequential element, that indicates respective one or more feedback elements, indicates respective feedback positions at the indicated feedback elements and indicates respective feedback control signals applied to the indicated feedback elements;
evaluating the feedback loop signature associated with such sequential element by calculating logic required to load a load data value into such sequential element so as to generate associated stimulus logic that;
receives as input at least one associated feedback loop control signal; and
provides as output an associated clock control signal that has a clock enable value during clock intervals when an associated load value would be provided to such sequential element by its associated feedback loop and that has a clock disable value during clock intervals when an associated reload value would be provided to such sequential element by its associated feedback loop;
generating associated load logic that
receives as input at least one associated feedback loop control signal and at least one load data; and provides as output at least one load data signal during clock intervals when the associated stimulus logic signature produces an associated clock control signal with a clock enable value.

17. The article of manufacture of claim 16 wherein the process further comprises:
for each of the respective one or more identified sequential elements with at least one associated feed back loop, replacing at least one feedback element of the at least one associated feedback loop by,
inserting associated clock gating control logic into the design description;
wherein the associated clock gating control logic includes,
an associated gating control element,
associated generated stimulus logic, and
a clock signal source,
wherein the gating control element receives as input a clock control signal output byte associated generated stimulus logic and also receives as input a clock source signal provided by the clock source and provides as output a clock input signal to a clock input node of such sequential element; and
inserting into the design description associated generated load logic that provides an associated load data output signal as a data output to such associated sequential element.

18. The article of manufacture of claim 16 wherein the process further comprises:
comparing respective feedback loop signatures to identify one or more corresponding sets of sequential elements associated with respective equivalent feedback loops; and
grouping into respective clock gating groups respective sequential elements associated with equivalent feedback loops;
wherein generating stimulus logic involves generating respective at least one shared stimulus logic associated with all of the sequential elements of an at least one respective identified clock gating group.

19. The article of manufacture of claim 16 wherein the process further comprises:
comparing respective feedback loop signatures to identify one or more corresponding sets of sequential elements associated with respective equivalent feedback loops; and
grouping into a respective primary clock gating group respective sequential elements associated with equivalent feedback loops;
further grouping respective sequential elements in the respective primary clock gating group into at least first and second secondary clock gating groups based upon at least one criterion; and
wherein generating stimulus logic involves generating respective first shared stimulus logic associated with the sequential elements of the first secondary clock gating group; and
wherein generating stimulus logic involves generating respective second shared stimulus logic associated with the sequential element of the second secondary clock gating group.

20. The article of manufacture of claim 16 wherein the process further comprises:
wherein identifying feedback loops includes identifying multiple feedback loops associated with at least one identified multi-feedback sequential element; and
wherein generating associated stimulus logic includes generating associated stimulus logic forte at least one identified multi-feedback sequential element; and
wherein generating associated load logic includes generating associated load logic for the at least one identified multi-feedback sequential element.

21. The article of manufacture of claim 16 wherein the process further comprises:
wherein identifying feedback loops includes identifying multiple feedback loops associated with at least one identified multi-feedback sequential element;
wherein generating associated stimulus logic includes generating associated stimulus logic for some but not all feedback loops associated with at least one identified multi-feedback sequential element; and
wherein generating associated load logic includes generating associated load logic for some but not all feedback loops associated with at least one identified multi-feedback sequential element.

22. The method of claim 16,
wherein generating associated load logic involves breaking at least one identified feedback loop and removing at least one feedback element associated with the at least one broken feedback loop.

23. A computer implemented method of deriving gated clock circuitry in an integrated circuit design comprising:
identifying a sequential element in the design;
identifying a feedback loop in the design associated with the identified sequential element and having multiple feedback elements;
wherein the identified feedback loop alternatively provides load data or provide reload data to their associated sequential elements;
producing a feedback loop signature for the identified feedback loop, that indicates the multiple feedback elements of the feedback loop, indicates feedback positions at the indicated feedback elements in the feedback loop and indicates respective feedback control signals applied to the indicated feedback elements in the feedback loop;
evaluating the feedback loop signature so as to generate associated stimulus logic that receives as input at least one associated feedback loop control signal;
provides as output an associated clock control signal that has a clock enable value during clock intervals when an associated load value would be provided to such sequential element by the identified feedback loop and that has a clock disable value during clock intervals when an associated reload value would be provided to such sequential element by the identified feedback loop;
generating associated load logic that
receives as input at least one associated feedback loop control signal; and
provides as output at least one load data signal during clock intervals when the associated stimulus logic signature produces an associated clock control signal with a clock enable value.

24. The method of claim 23,
wherein generating associated load logic involves breaking the identified feedback loop and removing at least one feedback element associated with the at least one broken feedback loop, so as to generate associated load logic.

25. The method of claim 23,
wherein evaluating the feedback loop signature associated with such sequential element so as to generate associated stimulus logic involves calculation of a negation of logic required to reload a currently stored value back into such sequential element.

26. The method of claim 23,
wherein evaluating the feedback loop signature associated with such sequential element so as to generate associated stimulus logic involves direct calculation of logic required to avoid reload of a currently stored value back into such sequential element.

27. The method of claim 23 further including:
receiving an integrated circuit design description that includes a register transfer level (RTL) description; and
converting the RTL description to an abstract representation of circuit design.

28. The method of claim 27,
wherein converting involves converting the RTL description to a generic netlist.

29. The method of claim 23,
wherein identifying the feedback loop, involves identifying each circuit path between a data output node and a data input node for the identified sequential elements.

30. The method of claim 23,
wherein each respective feedback element includes a multiplexer.

31. The method of claim 23 further including:
for each of the respective one or more identified sequential elements with the associated feed back loop, replacing at least one feedback element of the one associated feedback loop by,
inserting associated clock gating control logic into the design description;
wherein the associated clock gating control logic includes,
an associated gating control element,
associated generated stimulus logic, and
a clock signal source,
wherein the gating control element receives as input a clock control signal output byte associated generated stimulus logic and also receives as input a clock source signal provided by the clock source and provides as output a clock input signal to a clock input node of such sequential element; and
inserting into the design description associated generated load logic that provides an associated load data output signal as a data input to such associated sequential element.

32. The method of claim 23 further including:
comparing respective feedback loop signatures to identify one or more corresponding sets of sequential elements associated with the respective equivalent feedback loop; and
grouping into respective clock gating groups respective sequential elements associated with the equivalent feedback loop;
wherein generating stimulus logic involves generating respective at least one shared stimulus logic associated with all of the sequential elements of an at least one respective identified clock gating group.

33. The method of claim 23 further including:
comparing respective feedback loop signatures to identify one or more corresponding sets of sequential elements associated with the respective equivalent feedback loop; and
grouping into a respective primary clock sating group respective sequential elements associated with the equivalent feedback loop;
further grouping respective sequential elements in the respective primary clock gating group into at least first and second secondary clock gating groups based upon at least one criterion; and
wherein generating stimulus logic involves generating respective first shared stimulus logic associated with the sequential elements of the first secondary clock gating group; and
wherein generating stimulus logic involves generating respective second shared stimulus logic associated with the sequential element of the second secondary clock gating group.

34. The method of claim 33 wherein the at least one criterion includes a criterion selected from the group: physical placement, fanout and user selection.

35. The method of claim 23,
wherein identifying the feedback loop includes identifying multiple feedback loops associated with at least one identified multi-feedback sequential element; and
wherein generating associated stimulus logic includes generating associated stimulus logic for the at least one identified multi-feedback sequential element; and
wherein generating associated load logic includes generating associated load logic for the at least one identified multi-feedback sequential element.

36. The method of claim 23,
wherein identifying the feedback loop includes identifying the feedback loop associated with at least one identified multi-feedback sequential element;
wherein generating associated stimulus logic includes generating associated stimulus logic for the feedback loop associated with at least one identified multi-feedback sequential element; and
wherein generating associated load logic includes generating associated load logic for the feedback loop associated with at least one identified multi-feedback sequential element.

37. The method of claim 23,
wherein generating associated load logic involves breaking at the identified feedback loop and removing at least one feedback element associated with the broken feedback loop.

* * * * *